United States Patent
Tihanyi

Patent Number: 5,869,864
Date of Patent: Feb. 9, 1999

[54] FIELD EFFECT CONTROLLED SEMICONDUCTOR COMPONENT

[75] Inventor: Jenoe Tihanyi, Kirchheim, Germany

[73] Assignee: Siemens Aktiengesellschaft, Munich, Germany

[21] Appl. No.: 834,311

[22] Filed: Apr. 15, 1997

Related U.S. Application Data

[63] Continuation-in-part of Ser. No. 539,175, Oct. 4, 1995, abandoned.

[30] Foreign Application Priority Data

Oct. 4, 1994 [DE] Germany .................. 44 35 458.4

[51] Int. Cl.$^6$ .................................................. H01L 29/76
[52] U.S. Cl. ............................................ 257/335; 257/382
[58] Field of Search .................. 257/329, 330, 257/335, 341, 345, 382

[56] References Cited

U.S. PATENT DOCUMENTS

| | | | |
|---|---|---|---|
| 5,341,011 | 8/1994 | Hshieh et al. | 257/335 |
| 5,428,234 | 6/1995 | Sumi | 257/335 |
| 5,463,241 | 10/1995 | Kubo | 257/382 |

Primary Examiner—Mark V. Prenty
Attorney, Agent, or Firm—Hill & Simpson

[57] ABSTRACT

A semiconductor component having a body with an upper surface, a base zone having a portion adjoining the upper surface of the semiconductor body, at least one source zone embedded in the base zone, at least one gate electrode lying parallel to the upper surface that covers at least the portion of the base zone adjoining the upper surface, a contact region constructed and arranged as a buried layer in the base zone and projecting laterally beyond the source zone, the contact region having a higher conductivity than that of the base zone, and an electrode that contacts the source zone and the contact region. In order to improve the contact between base zone and source electrode, the contact region is fashioned as a layer buried in the base zone and projects laterally beyond the source zone. Also, a field effect controlled semiconductor component having at least one source zone, at least one vertical gate electrode arranged in a trench lying vertically relative to the surface, at least one base zone that laterally abuts the trench, a contact region having a depth greater than that of the source zone and a conductivity higher than that of the base zone and is electrically connected thereto, and an electrode that contacts the source zone and the contact region.

3 Claims, 2 Drawing Sheets

FIELD EFFECT CONTROLLED SEMICONDUCTOR COMPONENT

This is a continuation-in-part of application Ser. No. 08/539,175 filed Oct. 4, 1995 now abandoned.

BACKGROUND OF THE INVENTION

1. Field of the Invention

The present invention is generally directed to semiconductors and more specifically to a semiconductor component controllable by field effect that largely avoids an activation of the parasitic bipolar transistor.

2. Description of the Related Art

Semiconductor components of this species have been described, for example, in the article by Chang and Holroyd, "High Voltage Power MOSFETS With a Trench-Gate Structure" in Solid-State Electronics, Vol. 33, No. 3, 1990, pp. 381–386. The source electrodes directly contact the source zones and contact the base zones via contact regions that have a higher conductivity than the base zones. These contact regions serve the purpose of improving the contact between the source electrode and the base zones. The contact regions disclosed in the article are fashioned such that minority charge carriers flowing off from the inside of the semiconductor body to the source electrode must flow in the lightly doped base zone partly along the pn-junction between source zone. The light doping here causes a high voltage drop-off at the pn-junction that causes an emission of charge carriers from the source zone when a quantity of approximately 0.5 volts is exceeded. The parasitic bipolar transistor composed of source zone, base zone and inner zone can thus be activated and the semiconductor component is destroyed.

SUMMARY OF THE INVENTION

It is an object of the invention to provide an improved semiconductor component that largely avoids an activation of the parasitic bipolar transistor.

In an embodiment of the present invention, this object is achieved in that a contact region is constructed and arranged as a layer buried in the base zone and projects laterally beyond the source zone. In another embodiment, the object is achieved in that the contact region has a depth that is greater than that of the source zone.

An embodiment of the present invention provides a field effect controlled semiconductor component having at least one source zone that is embedded into a base zone having a portion adjoining an upper surface of a semiconductor body. The semiconductor component also has at least one gate electrode lying parallel to the surface that covers at least the adjoining portion of the base zone and a contact region connected to the base zone that has a higher conductivity than the base zone. The contact region is a buried layer in the base zone. Also, the semiconductor component has an electrode that contacts the source zone and the contact region.

Alternatively, the present invention is directed to a semiconductor component controllable by field effect having the following features: at least one source zone; at least one vertical gate electrode arranged in a trench lying vertically relative to the surface; at least one base zone that laterally abuts the trench; a contact region that has higher conductivity than the base zone and is electrically connected thereto; and an electrode that contacts the source zone and the contact region.

The invention shall be set forth in greater detail with reference to two exemplary embodiments in conjunction with the following drawings.

DETAILED DESCRIPTION OF THE PREFERRED EMBODIMENTS

Figure 1:
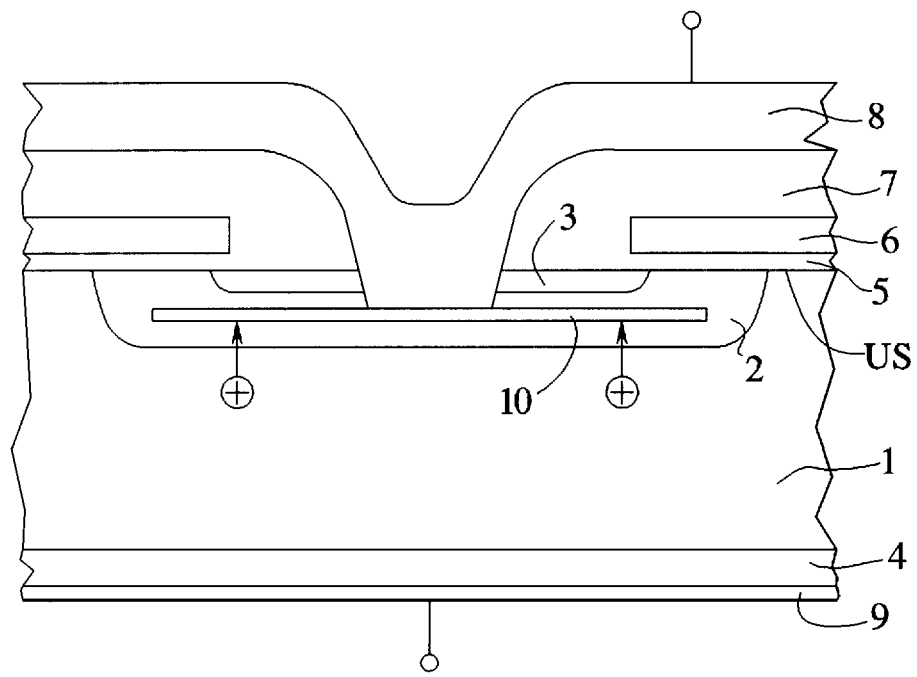
FIG. 1 is a sectional view of an embodiment of the present invention illustrating a section through the semiconductor component with a horizontal gate.

In an exemplary embodiment of the present invention illustrated in FIG. 1, an inner zone 1 of the semiconductor component is illustrated. A base zone 2 is embedded into the inner zone 1. The base zone 2 partially adjoins an upper surface US of the semiconductor body. A source zone 3 that likewise adjoins the upper surface US of the semiconductor body is embedded into the base zone 2. An anode zone 4 adjoins that side of the inner zone 1 facing away from the base zone 2. This anode zone 4 is connected to an electrode 9.

The zone sequence $n^+ pnn^+$ for a power MOSFET or, respectively, $n^+ pnp^+$ for an IGBT proceeds from the source zone in a semiconductor component having n-conductive channel. The conductivity types are inverse for a semiconductor component having p-channel.

A first insulating layer 5 is applied on the source-side surface of the semiconductor body. A gate electrode 6 is arranged on this first insulating layer 5. The gate electrode 6 is in turn covered with a second insulating layer 7. An electrode 8 is provided for contacting the source zone 3 and the base zone 2. This electrode 8 contacts the base zone 2 through a contact window provided in the source zone 3 and in the insulating layers 5 and 7.

For improving the contact between the electrode 8 and the base zone 2, a contact region 10 that has a higher conductivity than the base zone 2 is arranged in the base zone 2. The contact region 10 is connected to the electrode 8 and to the base zone 2. The contact region 10 is constructed and arranged as a buried layer and projects laterally beyond the source zone 3. However, it does not extend up to the upper surface US of the semiconductor body since this influences the cut off voltage of the semiconductor component.

The buried layer contact region 10, for example, can be a semiconductor region of the conductivity type of the base zone 2 that is far more highly doped than the base zone 2.

The contact region 10 can also be composed of highly doped polysilicon, a metal silicide or a metal.

Figure 1A:
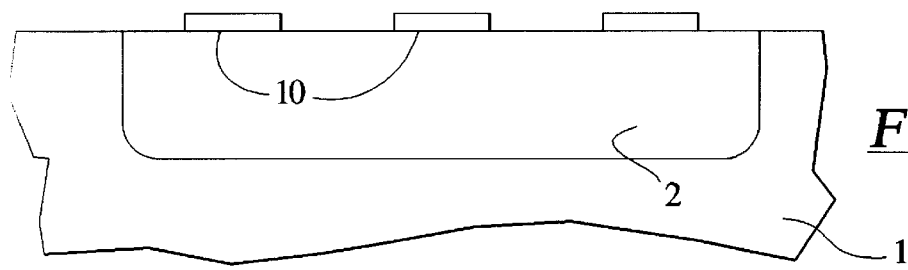
FIG. 1a is a sectional view of an embodiment of the present invention illustrating the manufacturing process of the buried layer contact region.
Figure 1B:
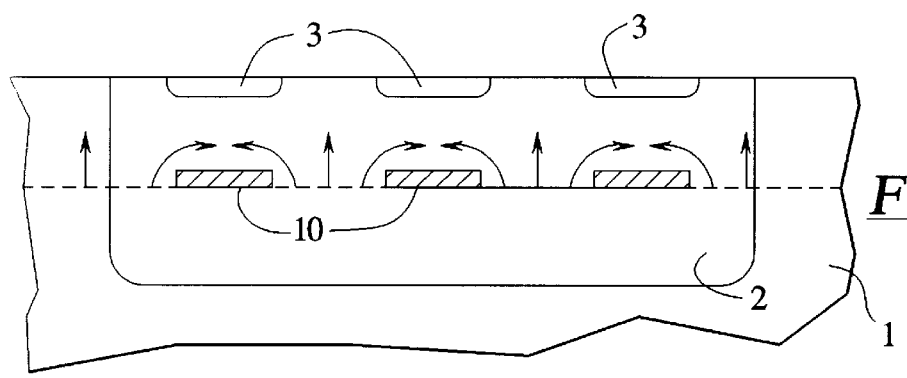
FIG. 1b is a sectional view of an embodiment of the present invention illustrating the manufacturing process for the buried layer contact region.

The contact region 10 may be manufactured by depositing a grid structure on the inner zone 1, shown in FIG. 1a as a semiconductor element, e.g. by means of CVD (chemical vapor deposition) as shown in FIG. 1a. The material of this grid structure can be either metal, metal silicide, polysilicon or a standard silicide. This grid structure forms the later contact region 10. The semiconductor element 1a, with the contact region 10 lying in a grid structure on the surface, is subsequently exposed to a temperature so that a monocrystalline silicon layer can grow epitaxially on the surface (FIG. 1b). The epitaxially grown layer has the same doping concentration and the same conductivity type as the semiconductor element 1a. Given a sufficient thickness of the epitaxial layer, the surface of the grid structure is also covered by the epitaxial layer. The epitaxial growth takes place until the desired epitaxial layer thickness has been deposited. The direction of the epitaxial growth is shown by the arrows in FIG. 1b. If the surface of the epitaxial layer is not sufficiently planar, a planarization step can be added. The source zone 3 is subsequently implanted using a known implantation process. The contacting of the contact region 10 with the source electrode 8 occurs by the standard method of contact hole etching and metallization. The base zone 2 is advantageously placed into the semiconductor element 1' before either the depositing of the grid structure or the epitaxy, e.g. by means of ion implantation or diffusion.

In the immediate vicinity of the surface of the semiconductor element 1a not covered by the grid structure, the silicon crystal is nearly perfectly monocrystalline. However, the crystal structure in the immediate vicinity of the surface of the metal grid can be difficult to reproduce in a monocrystalline manner. This means that the silicon crystal immediately above the surface of the metal grid is largely amorphous or is largely of a polycrystalline structure. As the thickness of the epitaxial layer increases, the monocrystallinicity of these regions increases. However, the quality of the crystal grid of the discussed regions immediately above the grid structure is of secondary importance, since these regions are largely etched away during the contact hole contacting. In any case, the electron currents or hole currents flow laterally to the channel zone of the base region 3 under the gate electrode 6 to the contact region 10. Almost no current flows via the polycrystalline regions above the metal grid.

In a further development, the quality of this epitaaial layer, in particular above the grid structure, can be further improved by depositing a thicker epitaxial layer than is necessary. The excess regions of the epitaxial layer are subsequently etched away. Thus, a nearly perfect monocrystalline epitaxial layer can grow on the grid structure.

Figure 2A:
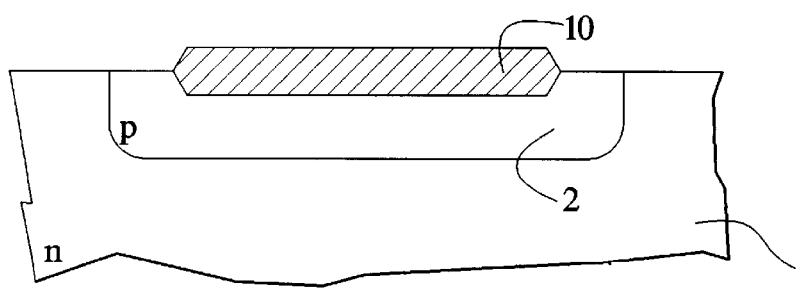
FIG. 2a is a sectional view of an embodiment of the present invention illustrating an alternative manufacturing process for the buried layer contact region.
Figure 2B:
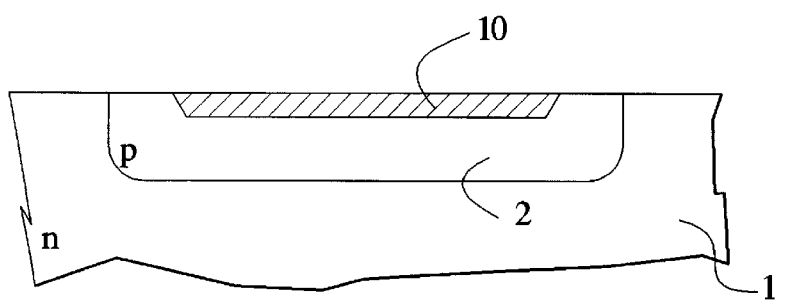
FIG. 2b is a sectional view of an embodiment of the present invention illustrating an alternative manufacturing process for the buried layer contact region.
Figure 2C:
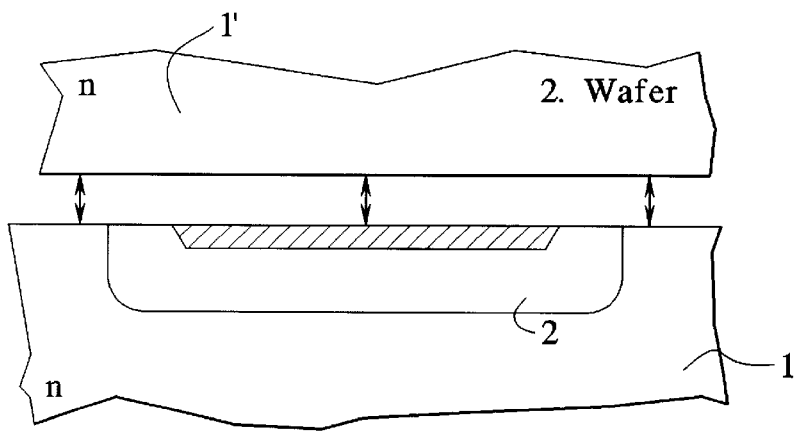
FIG. 2c is a sectional view of an embodiment of the present invention illustrating an alternative manufacturing process for the buried layer contact region.

The buried layered contact region 10 may also be manufactured by depositing the contact region 10 on the p-doped tub of the base zone 2 (FIG. 2a). The contact region 10 is typically formed by a silicide. It is also possible to use metal or polysilicon here as the material for the contact region 10. The surface of the semiconductor element is subsequently planarized (FIG. 2b). A second semiconductor element 1a', with the same doping concentration and the same conductivity type, is then attached to the surface of the semiconductor element la by means of direct wafer bonding (FIG. 2c).

The second semiconductor element 1a' is etched away to the desired thickness. The source zone 3 is then implanted by means of ion implantation. The remaining steps of the contact hole contacting and metallization subsequently follow.

While the above presents two different possibilities for the manufacture of the contact region 10, other ways of manufacturing this contact region are also possible.

The minority charge carriers generated in the inside of the semiconductor body —i.e., hole electrons in the case of a semiconductor component of the n-channel type—flow from the inner zone 1 to the base zone 2 and are captured there by the contact region 10. The hole electrons then flow from the low-impedance contact region 10 to the electrode 8. The voltage drop-off at the pn-junction thereby arising between the source zone 3 and the base zone 2 remains so low that the value of 0.5 volts is not reached.

Figure 3:
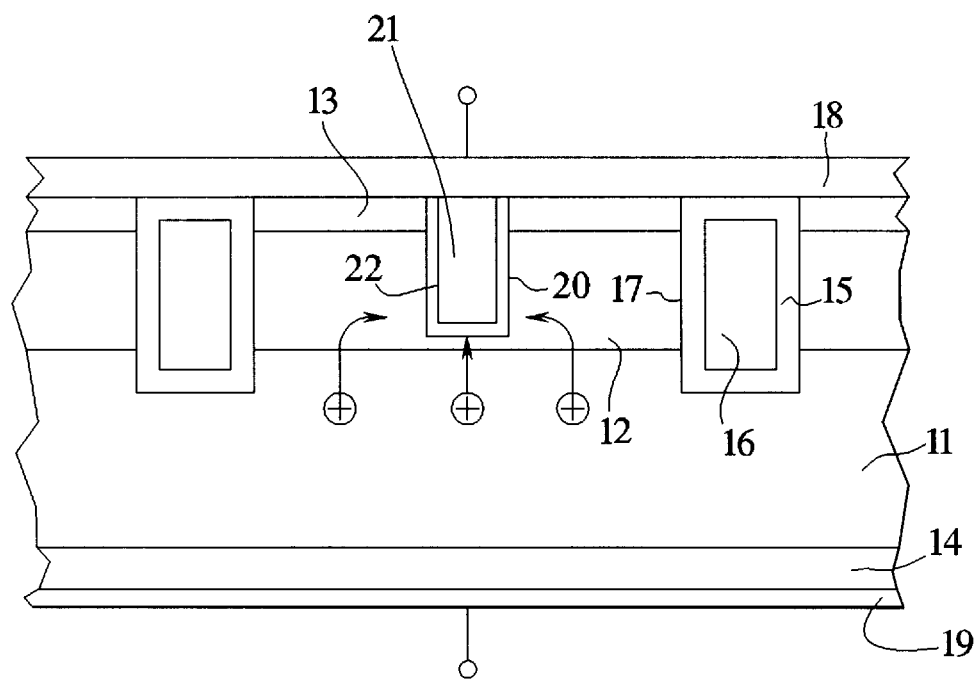
FIG. 3 is a sectional view of an embodiment of the present invention illustrating a section through a semiconductor component having what is referred to as a "trench gate".

FIG. 3 illustrates another embodiment of the present invention of a semiconductor component having an inner zone 11 which is adjoined by a base zone 12. A source zone 13 that comes to the surface of the semiconductor body adjoins the base zone 12. A further zone 14 is provided at that side facing away from the base zone, this further zone 14 having the same conductivity type as the inner zone 11 in the case of a power MOSFET and having the opposite conductivity type in the case of an IGBT. The further zone 14 is connected to an electrode 19.

A vertical gate electrode 16 is provided in a trench 17 oriented vertically to the surface. The trench 17 is constructed and arranged in the source zone 13 and the base zone 12. The gate electrode 16 is electrically insulated from the base zone 12 and the source zone 13 by an insulating layer 15. The gate electrode 16 overlaps the source zone 13 and the inner zone 11 and extends over the entire depth of the base zone 12.

The source zone 13 is contacted by an electrode 18. The electrode 18 also contacts the base zone 12 via a contact region 22. This contact region can be arranged at walls 20 of a trench 21 extending from the surface into the semiconductor body. The contact region 22 is connected to the electrode 18 and is in contact with the base zone 12. It has a higher conductivity than the base zone 12.

Minority charge carriers stemming from the inner zone 11 then flow via the contact region 22 to the source electrode 18 instead of flowing parallel the pn-junction lying between the source zone 13 and the base zone 12. An activation of the parasitic bipolar transistor is thus prevented.

The contact region 22, for example, can be produced by implantation of boron ions when the base zone 12 is p-conductive. Ions are also implanted into the walls 20 of the trench 21 due to scatter of the ions to be implanted. Given an appropriate design of the ions, for example, it is then also possible to produce the base zone 12 by drive-out of the boron ions from the contact region 22.

The contact region 22, for example, can also be composed of doped polysilicon, of a metal silicide or of a metal. The contact region can also be produced in that the trench 21 is entirely filled with doped polysilicon or metal. In any case, however, it is deeper than the depth of the source zone 13, but does not penetrate up to the inner zone 11.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. A field effect controlled semiconductor component, comprising:
   a semiconductor body having an upper surface;
   a base zone having a portion adjoining the upper surface of the semiconductor body;
   at least one source zone embedded in the base zone;
   at least one gate electrode lying parallel to the upper surface that covers at least the portion of the base zone adjoining the upper surface;
   a contact region comprising a metal constructed and arranged as a buried layer in the base zone and projecting laterally beyond the source zone, the contact region having a higher conductivity than that of the base zone; and
   an electrode that contacts the source zone and the contact region.

2. A field effect controlled semiconductor component, comprising:
   a semiconductor body having an upper surface;
   a base zone having a portion adjoining the upper surface of the semiconductor body;
   at least one source zone embedded in the base zone;
   at least one gate electrode lying parallel to the upper surface that covers at least the portion of the base zone adjoining the upper surface;
   a contact region comprising doped polysilicon constructed and arranged as a buried layer in the base zone and projecting laterally beyond the source zone, the contact region having a higher conductivity than that of the base zone; and
   an electrode that contacts the source zone and the contact region.

3. A field effect controlled semiconductor component, comprising:
   a semiconductor body having an upper surface;
   a base zone having a portion adjoining the upper surface of the semiconductor body;
   at least one source zone embedded in the base zone;
   at least one gate electrode lying parallel to the upper surface that covers at least the portion of the base zone adjoining the upper surface;
   a contact region comprising a metal silicide constructed and arranged as a buried layer in the base zone and projecting laterally beyond the source zone, the contact region having a higher conductivity than that of the base zone; and
   an electrode that contacts the source zone and the contact region.

* * * * *